United States Patent [19]

Shoda

[11] Patent Number: 5,341,380
[45] Date of Patent: Aug. 23, 1994

[54] LARGE-SCALE INTEGRATED CIRCUIT DEVICE

[75] Inventor: Masahiro Shoda, Tokyo, Japan

[73] Assignee: NEC Corporation, Tokyo, Japan

[21] Appl. No.: 29,029

[22] Filed: Mar. 10, 1993

[30] Foreign Application Priority Data

Mar. 19, 1992 [JP] Japan .................................. 4-063929

[51] Int. Cl.$^5$ .......................................... H04B 17/00
[52] U.S. Cl. .................................. 371/22.3; 371/15.1
[58] Field of Search ...................... 371/22.3, 15.1, 22.5

[56] References Cited

U.S. PATENT DOCUMENTS

| | | | |
|---|---|---|---|
| 4,879,717 | 11/1989 | Saverwald et al. ................. | 371/22.3 |
| 5,130,988 | 7/1992 | Wilcox et al. ........................ | 371/22.3 |
| 5,198,759 | 3/1993 | Ohnesorge . | |
| 5,225,772 | 7/1993 | Cheung et al. ....................... | 371/15.1 |

FOREIGN PATENT DOCUMENTS 1205647 2/1988 Japan .

*Primary Examiner*—Robert W. Beausoliel, Jr.
*Assistant Examiner*—Albert Decady
*Attorney, Agent, or Firm*—Whitham, Curtis & Whitham

[57] ABSTRACT

A large-scale integrated circuit, according to the present invention, comprises an integrated circuit function block having an original circuit function as the integrated circuit, a serial bus function block for setting and changing of an internal function of the integrated circuit function block, the serial bus function block including a clock terminal for receiving a clock signal, a bus busy terminal receiving a serial bus busy signal as an operation designating signal, and a serial data terminal receiving a serial data, a boundary scanning function block for checking wiring of the integrated circuit function block after installation on a circuit board, the boundary scanning function block including a clock terminal receiving a clock signal, a test mode select terminal for receiving a rest mode select signal as an operation designation signal and a test data terminal for receiving a test data, and the serial bus function block and the boundary scanning function block being so coupled to so that at least one of pairs of terminals consisted of both of the clock terminals, the bus busy terminal and the test mode select terminal, and the serial data terminal and the test data terminal being formed with a common terminal.

8 Claims, 9 Drawing Sheets

FIG. 8

LARGE-SCALE INTEGRATED CIRCUIT DEVICE

BACKGROUND OF THE INVENTION

The present invention relates generally to a large-scale integrated circuit device (hereafter referred to as LSI). More specifically, the invention relates to a LSI including a serial bus function for externally performing setting and changing internal functions through a serial bus and a boundary scanning function for performing checking of wiring after installation on a circuit board.

For externally setting and changing internal functions of the LSI, there has been proposed a method to vary a set value of an internal coefficient or so forth by the serial bus function as disclosed in Japanese Unexamined Patent Publication No. 1-205647. For instance, in case of the LSI for control, it is required to externally set a coefficient of an internal multiplier or to vary a delay amount for changing function of a circuit system, in which the LSI is installed. In such case, the above-mentioned serial bus function is used.

On the other hand, there are available LSIs incorporating the boundary scanning function as standardized by IEEE 1149.1. Such LSIs permits identification of a faulty portion by checking soldering failure, pattern failure, functions of the LSI per se by the boundary scanning function after installation on the circuit board.

FIG. 7 is a schematic block diagram of the LSI having the serial bus function. A serial/parallel converter 101 converts a serial data (SID) 109 externally input as an internal coefficient into a parallel data 110. The parallel data becomes an input for a plurality of registers 106 and 107. A register selector 105 generates a selection control signal 116 and 117 for determining the register to store the parallel data 110. The data (internal coefficient) 118 stored in one of the registers 106 and 107 is set in a LSI function block 1.

An address decoder 102 judges whether a main address is the address of the LSI per se when the parallel data 110 is a main address signal. When the address is the address of the LSI per se, a matching signal 111 becomes active and is outputted to a state controller 103. The state controller 103 uses the matching signal 111 and a bus busy signal (SIB) 112 and a clock signal (SIK) 113 as inputs, and generates an enabling signal 115 for enabling the register selector 105 in synchronism with the clock signal 113 when both of the matching signal 111 and the bus busy signal 112 are active.

A sub-address decoder 104 generates a selection signal for selecting one of a plurality of registers 106 and 107 through checking of a sub-address when the parallel data 110 is a sub-address signal, and outputs the sub-address signal to the register selector 105. The register selector 105 generates the above-mentioned selection control signal 116 and 117 on the basis of the selection signal 114 and the enabling signal 115.

Figure 8:
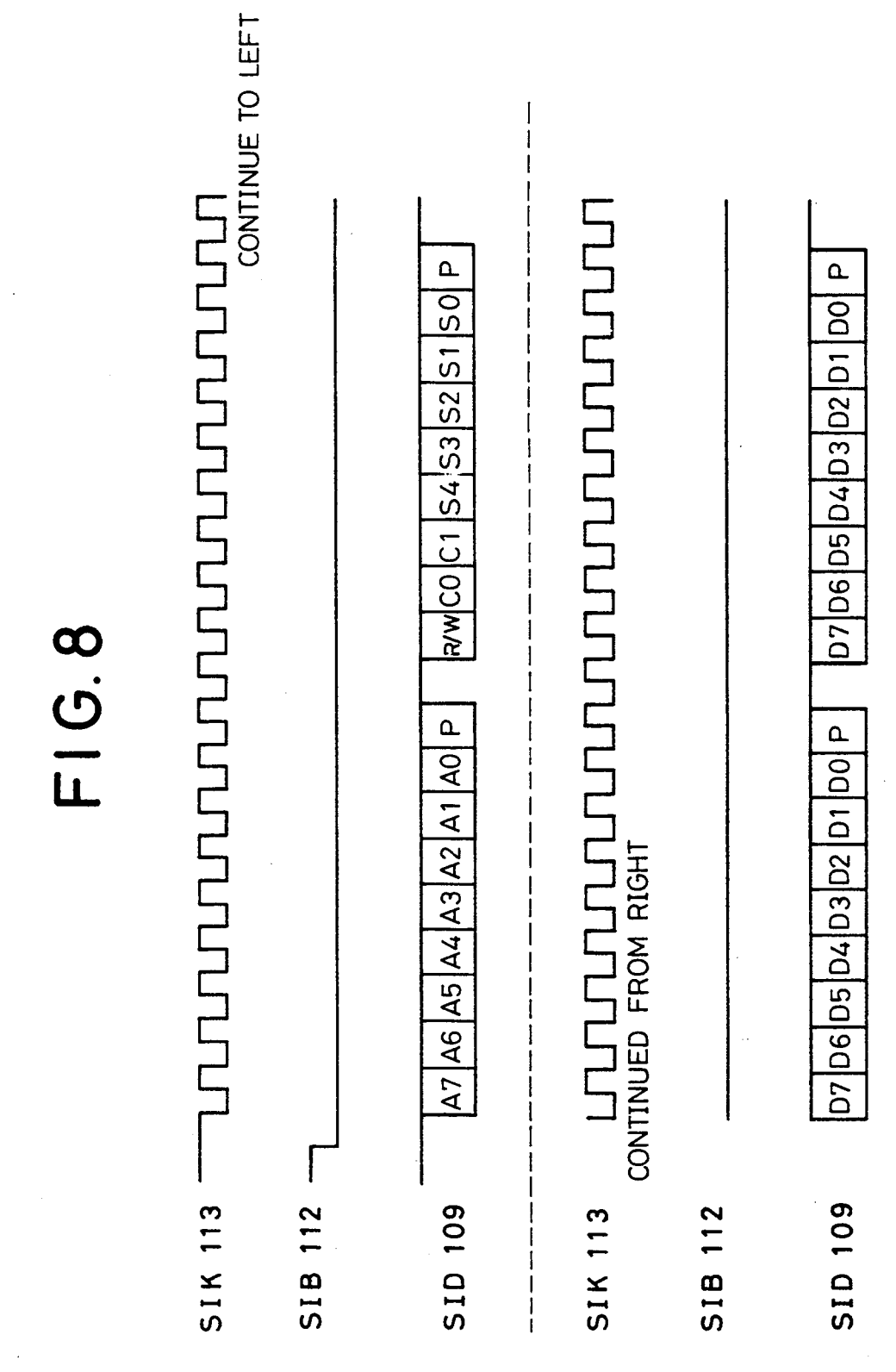

FIG. 8 shows a timing chart illustrating an operation of the serial bus function. It should be noted, the right side end of each signal above the broken line is continued to the left side end of the corresponding signal.

Initially, when the bus busy signal 112 is turned into Low level, the serial bus function initiates operation. The serial data 109 in synchronism with the clock signal 113 is converted into the parallel data 110 by the serial/parallel converter 101. The parallel data 110 for main addresses A7~A0 as illustration in FIG. 8 is checked whether it is the address of the LSI per se or not by the address decoder 102. If the address is that of the LSI per se, the matching signal 111 becomes active. Then, the state controller 103 recognizes that the input signal on the data 109 input subsequently to the main address A7~A0 is for its own data to make the enabling signal 115 active for enabling the register selector 105.

In the sub-address decoder 104, check is performed for the subsequently supplied signals, such as sub-address and so forth, as input signal on the data 109 {R/W (indicative of the input direction), C0~C1 (chip select), S4~S0 (sub-address) of FIG. 8} for generating the selection signal 114 selecting one of the registers 106 and 107. Based on the signal designated by the sub-address, the register selector 105 generates the selection control signal 116, 117 for selecting the register. At this time, the serial data D7~D0 on the data 109 is stored in the selected register through serial/parallel conversion and thus the operation of the LSI function block is designated by the data (designation signal) 118.

For realizing such serial bus function, it becomes necessary to provide at least three terminals, i.e. a data input 109, a bus busy input 112 and a clock input 113, as shown in FIG. 7.

Next, the LSI having the boundary scanning function will be schematically illustrated in FIG. 9. A TAP controller 201 generates various signals 215, 216, 224 and 225 for controlling the boundary scanning function depending upon the state of a test mode signal (TMS) 213 which varies in synchronism with a test clock 214.

A test data (TDI) 212 is input as a serial data and output as a test data output (TDO) 227 based on operating conditions designated by the test access port (TAP) controller 201 through the following three paths. The first path is a path established through input/output cells 207, 208 provided between the LSI function block 1 and signal input/output, serial lines 219, 222, 226 to the test data output 227. The second path is a path established through a by-pass 205, serial lines 220, 222, 226 to the test data output 227. The third path is a path established through an instruction register 202, serial lines 223, 226 to the test data output 227.

Multiplexers 209 and 210 are adapted to select these three paths depending upon control signals 221 and 224. A buffer 211 is adapted to lead the output 226 of the multiplexer 210 to the test data output 227 depending upon a control signal 225.

It should be noted that an instruction decoder 203 decodes an instruction 217 from the instruction register 202 to generate a control signal 218 for a boundary register portion 204 and a control signal 221 for the multiplexer 209. Resistors 228 and 229 pull up the test data input 212 and the test mode signal 213, respectively.

Operation of the boundary scanning function is illustrated in FIG. 10 in a form of operational timing chart. In FIG. 10, the right side ends of the respective signal illustrated above the broken line are continued to the left side ends of the corresponding signals illustrated below the broken line.

Data IR of the test data input 212 is fed to the instruction register 202 in synchronism with the clock signal 214. At this time, TAP controller 201 generates an instruction register control signal 216 for controlling to write the instruction set by the data IR in the instruction register 202. The instruction 217 written in the instruction register 202 is output to the instruction decoder 203. The instruction decoder 203 outputs the control signal 218 to the boundary register portion 204 according to a timing signal 215 from the TAP controller 201.

After completion of instruction, the data DR on the test data input 212 is shifted to the input cell 207 and the output cell 208 in order. At this time, repeated operation of outputting designated data the output terminals of the input/output cells 207 and 208 and reading levels of input terminals connected to the output terminals. By this, solder failure, pattern breakage and so forth on the circuit board can be checked.

The multiplexers 209 and 210 are selected by the selection signals 221 and 224 as the outputs of the instruction decoder 203 and the TAP controller 201. The buffer 211 determines whether the test data output 227 is activated based on the enabling signal 225 of the TAP controller 201.

The important functions in this boundary scanning function are those in the input/out cells 207 and 208. The input/output cells 207 and 208 are provided between the LSI function block 1 and input/output pins (not shown) and are provided functions for controlling output data and sampling input data for detecting solder failure, pattern breakage on the circuit board.

For realizing this boundary scanning function, it is also required at least four terminals, i.e. the test data input 212, the test mode select signal 213, the test clock signal 216 and the test data output 227. Furthermore, although is not illustrated in FIG. 9, even when a test reset terminal may be employed.

The above-mentioned two functions are useful and mutually independent. Toward the future, LSIs having these two functions will be increased. However, on the other hand, for the LSI incorporating the serial bus function, at least three terminals are necessary, and for the LSI incorporating the boundary scanning function, at least four, but possible five terminals. Furthermore, when both functions are intended to be incorporated in LSI, at least seven, possibly eight terminals are required to be additional included. This results in increasing of the size of the LSI package. Furthermore, it is possible to inherently cause necessity of removal of useful terminals for installing the additional terminals. In addition, it becomes necessary to provide the wiring pattern adapted to the additional terminals and to cause difficulty in designing the layout.

SUMMARY OF THE INVENTION

It is an object of the present invention to provide a large-scale integrated circuit device which can reduce number of additional terminals required associating with incorporation of a serial bus function and a boundary scanning function.

In order to accomplish the above-mentioned and other objects, a large-scale integrated circuit, according to the present invention, comprises:

an integrated circuit function block having an original circuit function as the integrated circuit;

a serial bus function block for setting and changing of an internal function of the integrated circuit function block, the serial bus function block including a clock terminal for receiving a clock signal, a bus busy terminal receiving a serial bus busy signal as an operation designating signal, and a serial data terminal receiving a serial data;

a boundary scanning function block for checking wiring of the integrated circuit function block after installation on a circuit board, the boundary scanning function block including a clock terminal receiving a clock signal, a test mode select terminal for receiving a rest mode select signal as an operation designation signal and a test data terminal for receiving a test data; and the serial bus function block and the boundary scanning function block being so coupled to so that at least one of pairs of terminals consisted of both of the clock terminals, the bus busy terminal and the test mode select terminal, and the serial data terminal and the test data terminal being formed with a common terminal.

In the preferred construction, at least a first pair consisted of the bus busy terminal and the test mode select terminal and a second pair consisted of the serial data terminal and the test data terminal are formed with common terminals, and the device further comprises:

a select terminal for receiving a select signal for selectively activating one of the serial bus function block and the boundary scanning function block;

means for activating the serial bus function block and deactivating the boundary scanning function block when the select signal represents requirement for activation of the serial bus function block; and means for activating the boundary scanning function block and deactivating the serial bus block when the select signal represents requirement for activation of the boundary scanning function block.

The large-scale integrated circuit device may further comprise:

means for blocking supply of a signal supplied to the common terminal of the first pair and a signal supplied to the common terminal of the second pair, to the boundary scanning function block when the select signal activates the serial bus function block; and means for blocking supply of a signal supplied to the common terminal of the first pair and a signal supplied to the common terminal of the second pair, to the serial bus function block when the select signal activates the boundary scanning function block.

Also, the in the preferred construction, at least a first pair consisted of the bus busy terminal and the test mode select terminal and a second pair consisted of the serial data terminal and the test data terminal are formed with common terminals; and the device may further comprise:

address detecting means provided in the serial bus function block for detecting a signal supplied to the common terminal of the second pair representing a specific address while the boundary scanning function block is deactivated state;

effectuation control means responsive to a detecting output of the address detecting means for making a signal supplied from the common terminal of the first pair to the boundary scanning function block effective; and activation control means provided in the boundary scanning function block and responsive to effectuation of the effectuation control means for activating the own function and deactivating the function of the serial bus function block.

In this case, the activation control means is constructed to generate an activation signal for activating own function in response to effectuation by the effectuation control means. The serial bus function block may include means for deactivating the detecting function of the address detecting means in response to the activation signal. Also, the activation control means is constructed to generate a deactivation signal for deactivating own function when a signal supplied to the common terminal of the first pair via the effectuation means is maintained for a predetermined period of time. Furthermore, the effectuation control means comprises a D-type flip-flop taking the activation signal as a data input and the detection output of the address detecting means as a reset input, and an OR gate taking the output of the D-type flip-flop as one input and the signal supplied to the common terminal of the first pair as another input.

BRIEF DESCRIPTION OF THE DRAWINGS

The present invention will be understood more fully from the detailed description given herebelow and from the accompanying drawing drawings of the preferred embodiment of the invention, which, however, should not be taken to be limitative to the invention, but are for explanation and understanding only.

In the drawings:

FIG. 8 is a timing chart showing the operation of the serial bus function block of FIG. 7;

DESCRIPTION OF THE PREFERRED EMBODIMENT

The preferred embodiments of the present invention will be discussed in detail herebelow with reference to the accompanying drawings, particularly to FIGS. 1~6.

Figure 1:
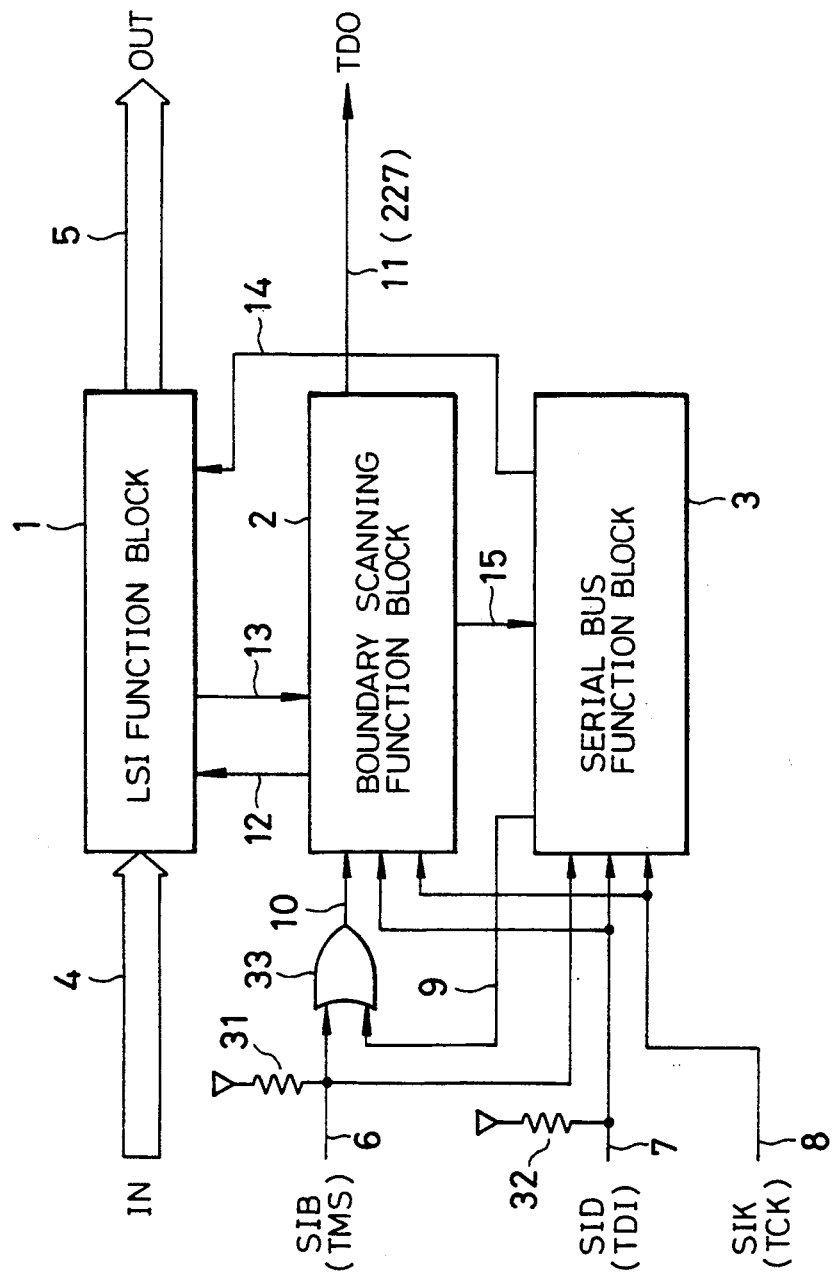
FIG. 1 is a block diagram of one embodiment of a large-scale integrated circuit device according to the present invention.

FIG. 1 is a block diagram showing the first embodiment of a large-scale integrated circuit device (LSI) according to the invention. The LSI is composed of a LSI function block 1 having an original LSI circuit function, a boundary scanning function block 2 and a serial bus function block 3. These three blocks are integrated. An input signal 4 and an output signal 5 are provided for the LSI function block 1.

Figure 3:
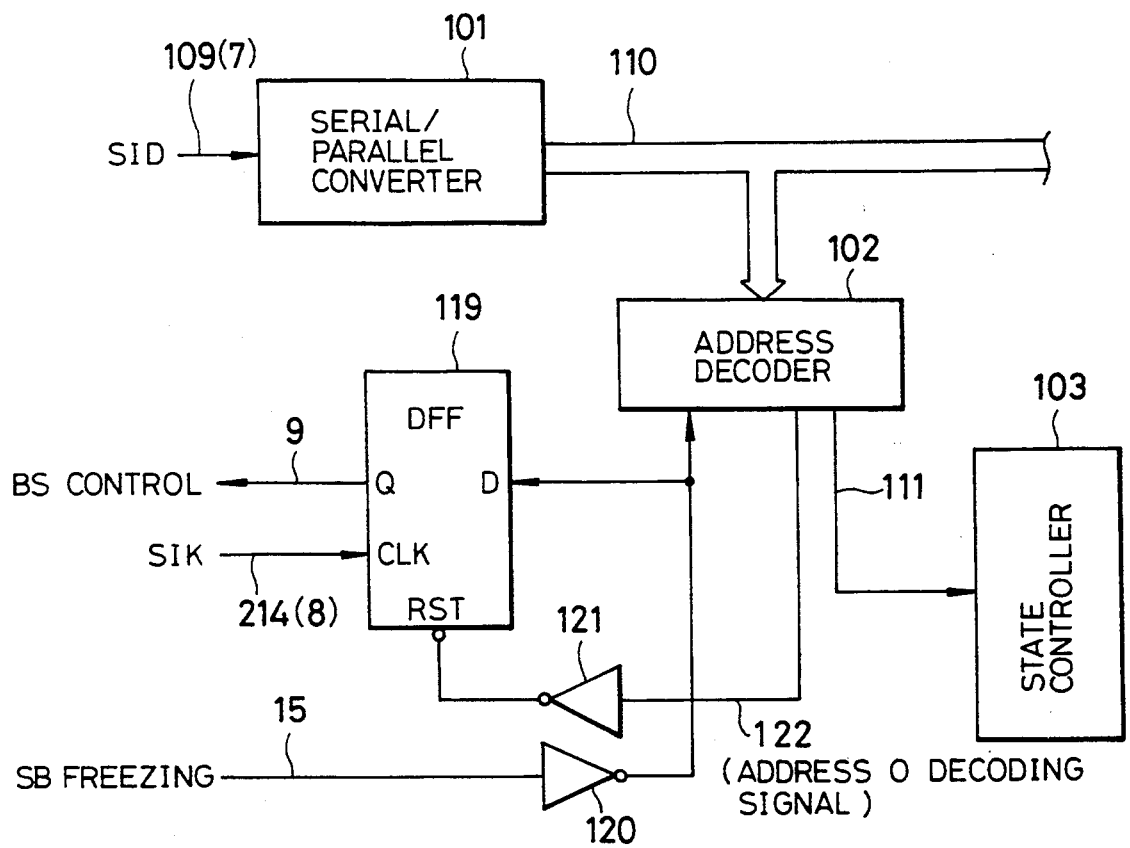
FIG. 3 is a circuit diagram showing a part of the preferred construction of a serial bus function block to be employed in one embodiment of the large-scale integrated circuit device of FIG. 1.
Figure 9:
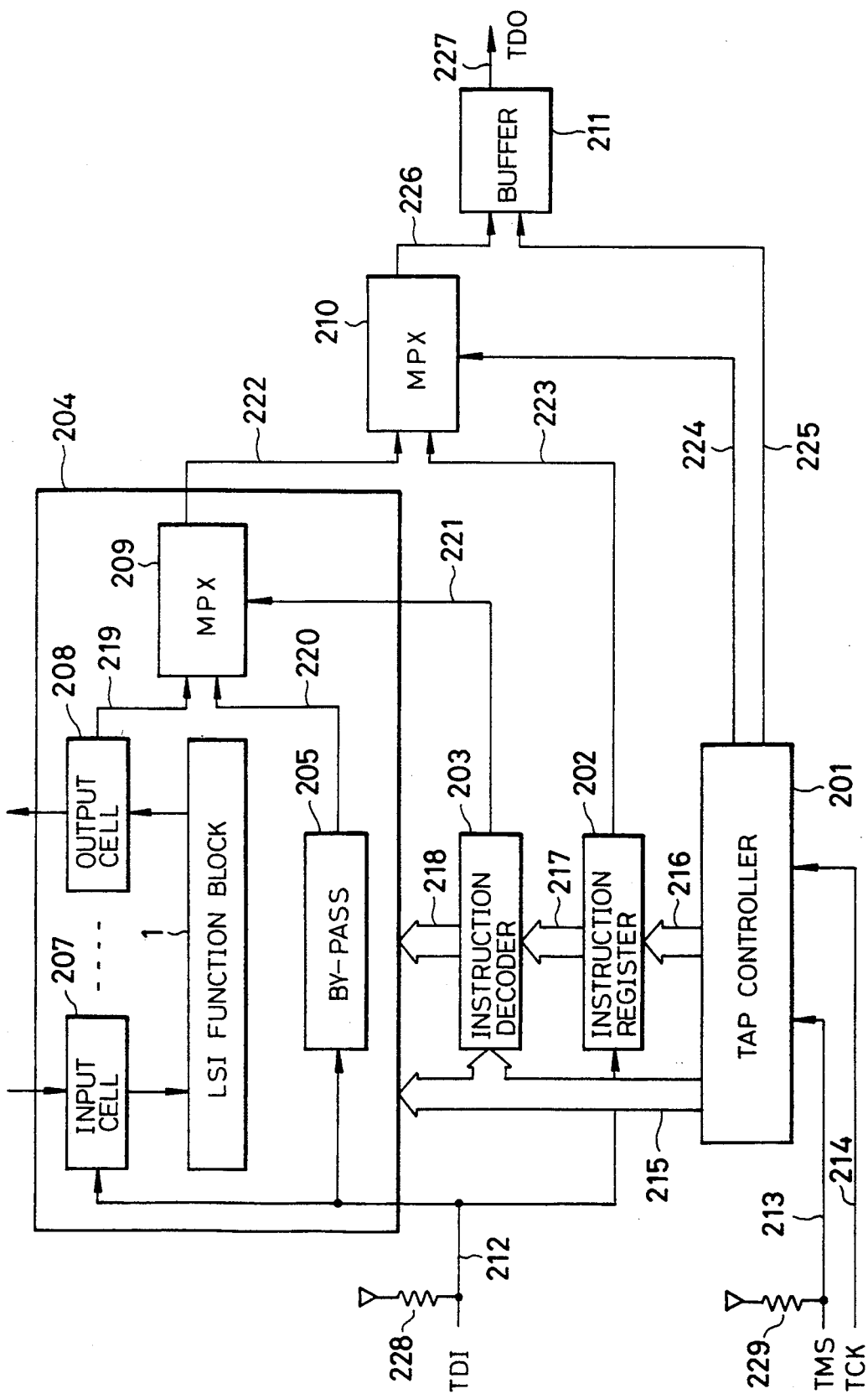
FIG. 9 is a block diagram showing construction of the boundary scanning function block.
Figure 10:
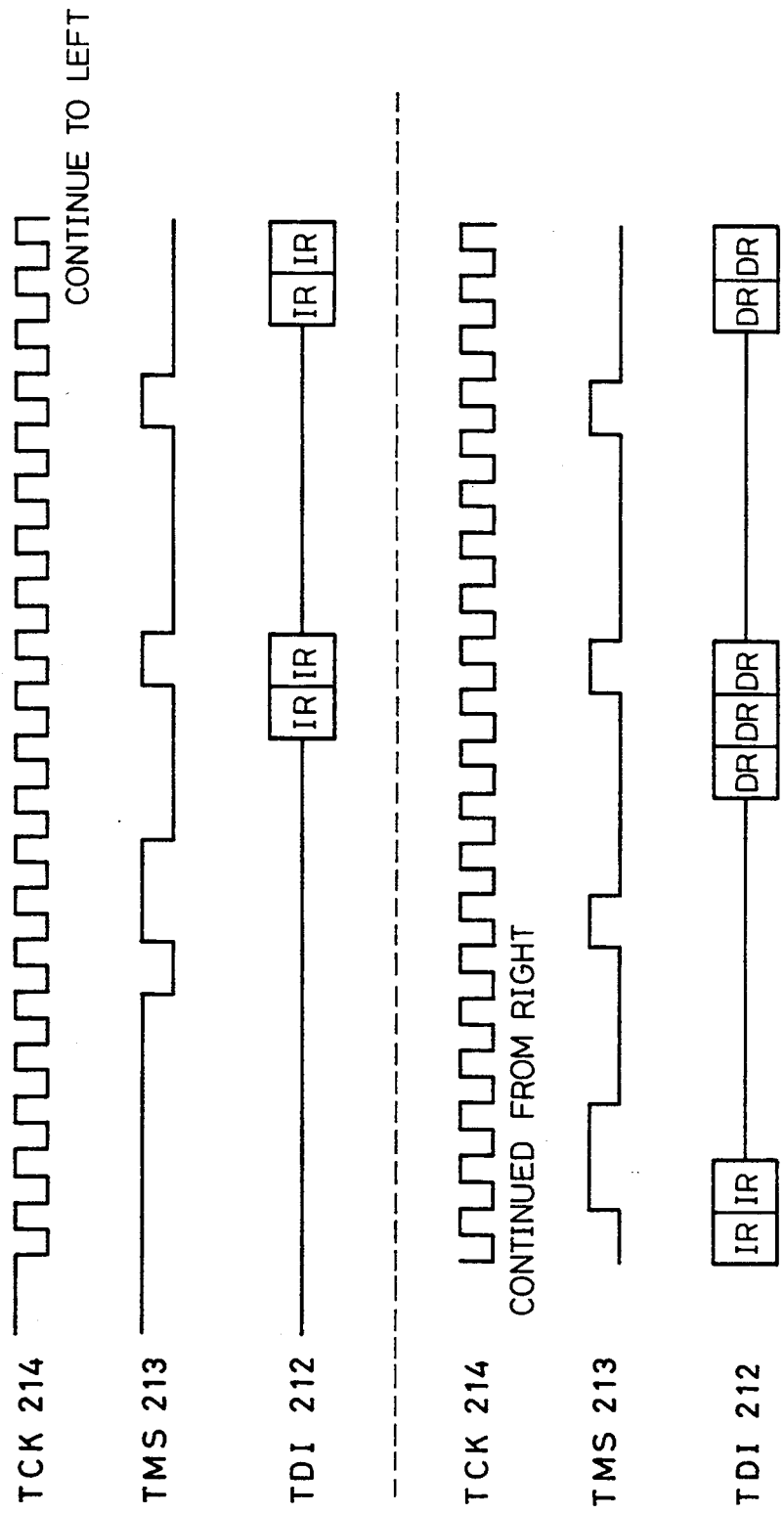
FIG. 10 is a timing chart showing operation of the boundary scanning function block of FIG. 9.

The boundary scanning function block 2 has the construction the same as that illustrated in FIG. 9 and has a boundary scanning function standardized by the provision of IEEE 1149.1 for identification of a faulty portion by checking soldering failure, pattern breakage, erroneous installation. The boundary scanning function block 2 controls input/output cells in the LSI function block 1 with a cell output signal 12 as an output to the input/output cells and a cell input signal 13 as an input from the input/output cells. On the other hand, as shown in FIG. 3, the serial bus function block 3 includes D-type flip-flop (D-FF) 119 and inverters 120 and 121 in addition to the construction illustrated in FIG. 7 set forth above, and is provided with a function for setting and changing coefficient for arithmetic circuit in the LSI function block, filter coefficient and so forth through a control signal 14.

In the present invention, a clock terminal 8 (corresponding to the clock terminal 113 in FIG. 7 and the test clock terminal 214 in FIG. 9) is employed in common to both blocks 2 and 3 for receiving a clock signal. Also, a data terminal 7 (corresponding to the serial data terminal 109 in FIG. 7 and the test data input terminal 212 in FIG. 9) is employed in common to both blocks 2 and 3 for receiving data signals. Furthermore, a control terminal 6 (corresponding to the bus busy terminal 112 of FIG. 7 and the test mode select terminal 213 of FIG. 9) is employed in common for both clocks 2 and 3 for receiving control signals as operation designating signals.

The control terminal 6 is pulled up by a pull-up resistor 31, serves as a test mode select terminal 10 (corresponding to TMS 213 of FIG. 9) of the boundary scanning function block 2 through an OR gate 33 and is directly connected to the bus busy terminal (corresponding to SIB 112 of FIG. 7) of the serial bus block 3. The data terminal pulled up by a pull-up resistor 32 serves as a test mode input terminal (corresponding to the TDI 212 of FIG. 9) for the boundary scanning function block 2 and also serves as the serial data terminal (corresponding to SID 109 of FIG. 7) for the serial bus function block 3. The clock terminal 8 serves as a test clock terminal (corresponding to the TCK 214 of FIG. 9) for the boundary scanning function block 2 and serves as a clock terminal (corresponding to SIK 113 of FIG. 7) for the serial bus function block 3.

A boundary scanning function block enabling control signal 9 is generated in the serial bus block 3, which is supplied to an OR gate 33 as one input. On the other hand, a serial bus block freezing signal 15 is generated in the boundary scanning function block 2 and input to the serial bus function block 3. As the serial bus freezing signal 15, a reset signal 15 generated as one of a control signal group 216 by the TAP controller 201 (the same as the TAP controller 201 of FIG. 9) is used.

Figure 2:
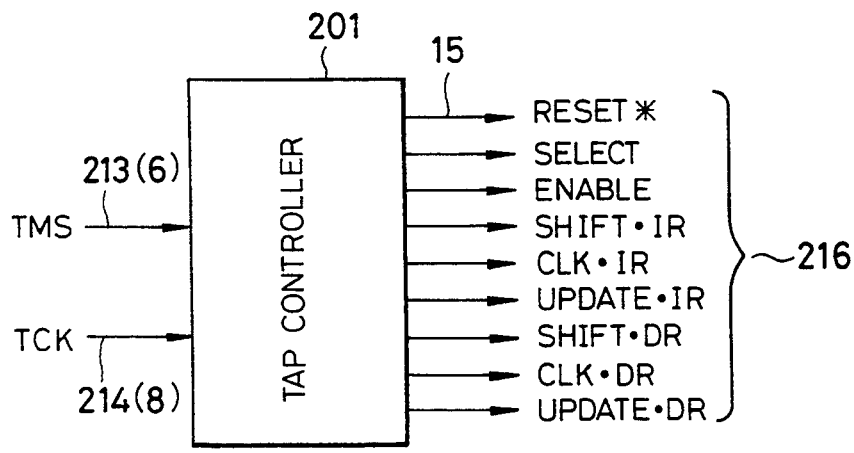
FIG. 2 is a diagrammatic illustration showing input and output signals of a TAP controller 201 in a boundary scanning function block to be employed in one embodiment of the large-scale integrated circuit device of FIG. 1.

The content of the control signal group 216 of the TAP (Test Access Port) controller 201 is defined in IEEE 1149.1, and illustrated in FIG. 2. Amongst, the reset signal 15 is adapted to be switched from HIGH level to LOW level while the test mode select signal (TMS) 6 is maintained at HIGH level for the period corresponding to five test clocks TCK 8 (214) and whereby switch the state of the boundary scanning function block 2 from the enabled state to the reset state. This reset signal is also used as the serial bus function block freezing (SB freezing) signal 15.

Figure 7:
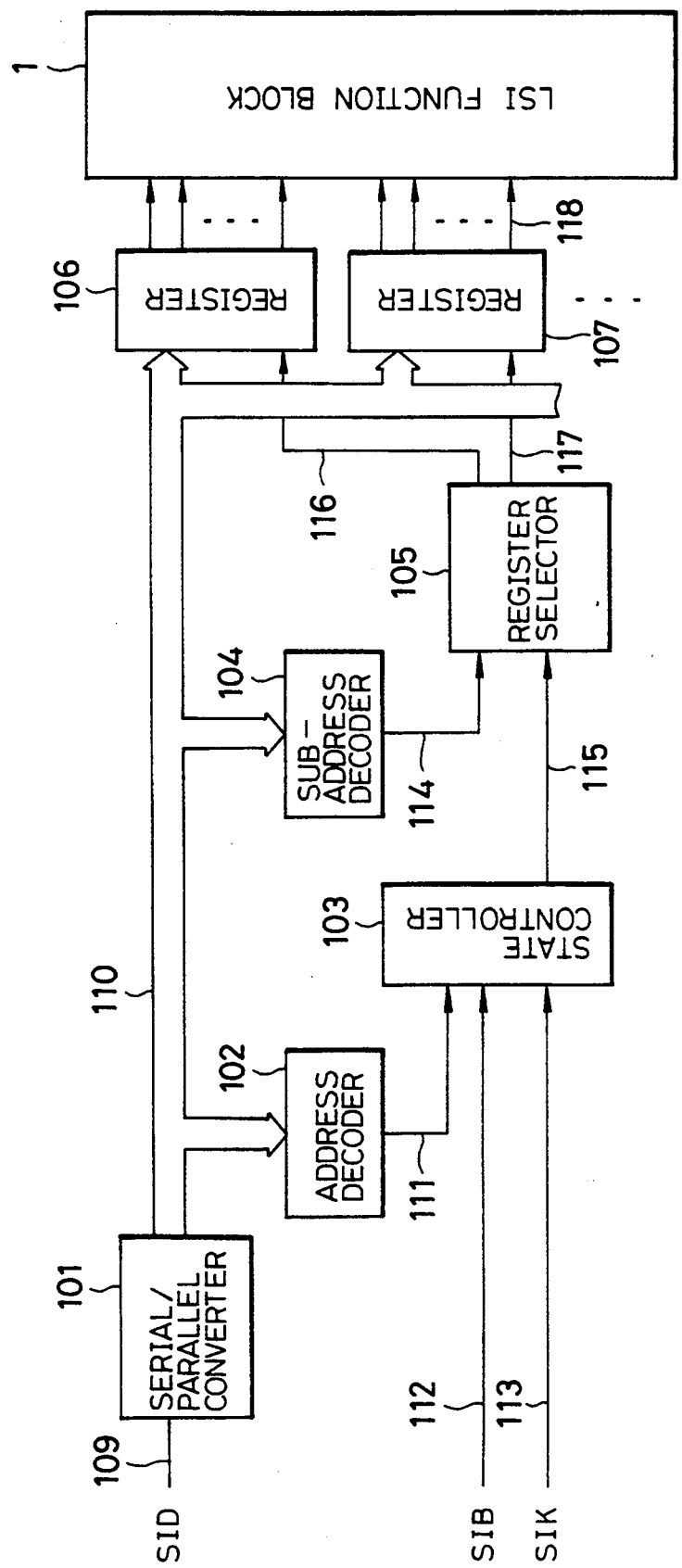
FIG. 7 is a block diagram showing construction of the serial bus function block.

FIG. 3 shows a block diagram showing the additional portion of the serial bus function block 3 which is added to the circuit of FIG. 7. The SB freezing signal 15 from the boundary scanning function block 2 serves as a decode inhibit signal for an address decoder 102 via an inverter 120. Also, the SB freezing signal 15 serves as a data input for the D-FF 119. The address decoder 102 turns a decoding output 122 into HIGH level when a specific address, such as (000000000) of a parallel address 110 of a serial/parallel converter 101 and supplies the HIGH level decoding output to the reset input of the D-FF 119 via an inverter 121. The Q output of this D-FF 119 becomes the input for the OR gate 33 of FIG. 1 as the boundary scanning function block enabling control signal (BS control signal). It should be noted that the clock 214 (8) is applied to the clock input of the D-FF 119.

Figure 4:
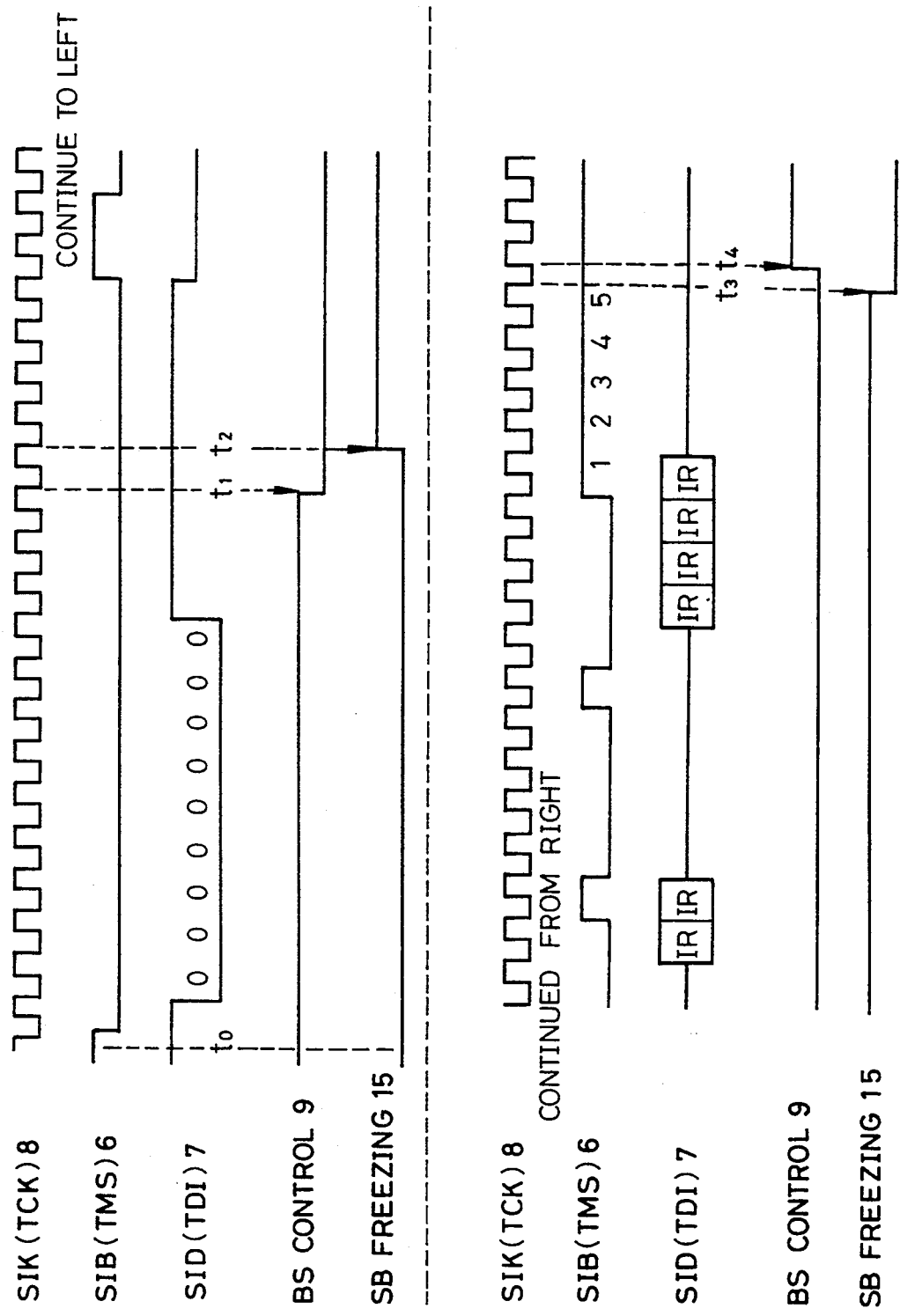
FIG. 4 is a timing chart showing operation of one embodiment of the large-scale integrated circuit of the invention.

FIG. 4 is a timing chart showing operation of the circuit of FIGS. 1~3. After turning ON of power supply, the clock is applied to the clock terminal 8. Both of the data terminal 7 and the control terminal 6 are controlled into HIGH level. When the elapsed period in maintaining the control terminal 6 at HIGH level reaches a corresponding period for five clocks, the reset signal 15 of the TAP controller 201 in the boundary scanning function block 2 becomes LOW level. At this time, the boundary scanning function block 2 is reset and falls into the disabled state. Since this reset signal is also used as the SB freezing signal 15, the address decoder 102 is enabled via the inverter 120 as illustrated in FIG. 3 and turns the data input of the D-FF 119 input HIGH level to output HIGH level Q output 9. Then, HIGH level is output at the Q output 9. Therefore, the boundary scanning function block enabling control signal (BS control signal) 9 becomes HIGH level so that subsequent variation of the test mode select signal 6 will not be transmitted to the boundary scanning function block 2 via the OR gate 33.

Namely, after a period corresponding to the length of five clock signals from power-ON, the boundary scanning function block 2 is reset and thus held in the disabled state, and conversely, the serial bus function block 3 is in the enabled state. This condition is shown at a time $t_0$ in FIG. 4.

At this condition, when the data signal at the data terminal 7 becomes (000000000), the data signal is detected by the address decoder 102 in the enabled state. Then, the address decoder 102 outputs HIGH level decoding output 122 to reset the D-FF 119. By this, the boundary scanning function block enabling control signal (BS control signal) becomes LOW level (time $t_1$) to permit input of the test mode select signal (TMS) 6 to the boundary scanning function block 2 via the OR gate 33. In conjunction therewith, the TAP controller 201 (FIG. 2) switches the respect signal 15 from LOW level to HIGH level upon sampling the low level of the test mode select signal (10) at the leading edge of the test clock TCK 8 (time $t_2$), for enabling the boundary scanning function block 2 and for freezing (disabling) the serial bus function block 3.

Therefore, after time $t_2$, the boundary scanning function block 2 initiate operation according to the input of the test mode select signal (TMS) 6 to perform the function of the boundary scanning function block 2, such as applying the test data from the test data input (TDI) 7 and outputting the data from the test data output (TDO) 11.

Next, when the test mode select signal 6 (10) is maintained at HIGH level for a period corresponding to at least five clock period, the reset signal 15 of the TAP controller 201 is switched from HIGH level to LOW level (time $t_3$) to disable the boundary scanning function block 2 by resetting. Since this reset signal serves as SB freezing signal 15, the address decoder 102 is enabled through the inverter 120 in FIG. 3 and the data input of the D-FF 119 becomes HIGH level to make the level of the Q output thereof HIGH. Accordingly, the boundary scanning function enabling control signal (BS control signal) becomes HIGH level (time $t_4$) so that the subsequent variation of the test mode select signal 6 will never been transmitted to the boundary scanning function block 2 via the OR gate 33. Namely, after time $t_4$, the boundary scanning function block 2 is held in the disabled state by resetting, and the serial bus function block 3 is held in the enabled state to perform serial bus function.

Figure 5:
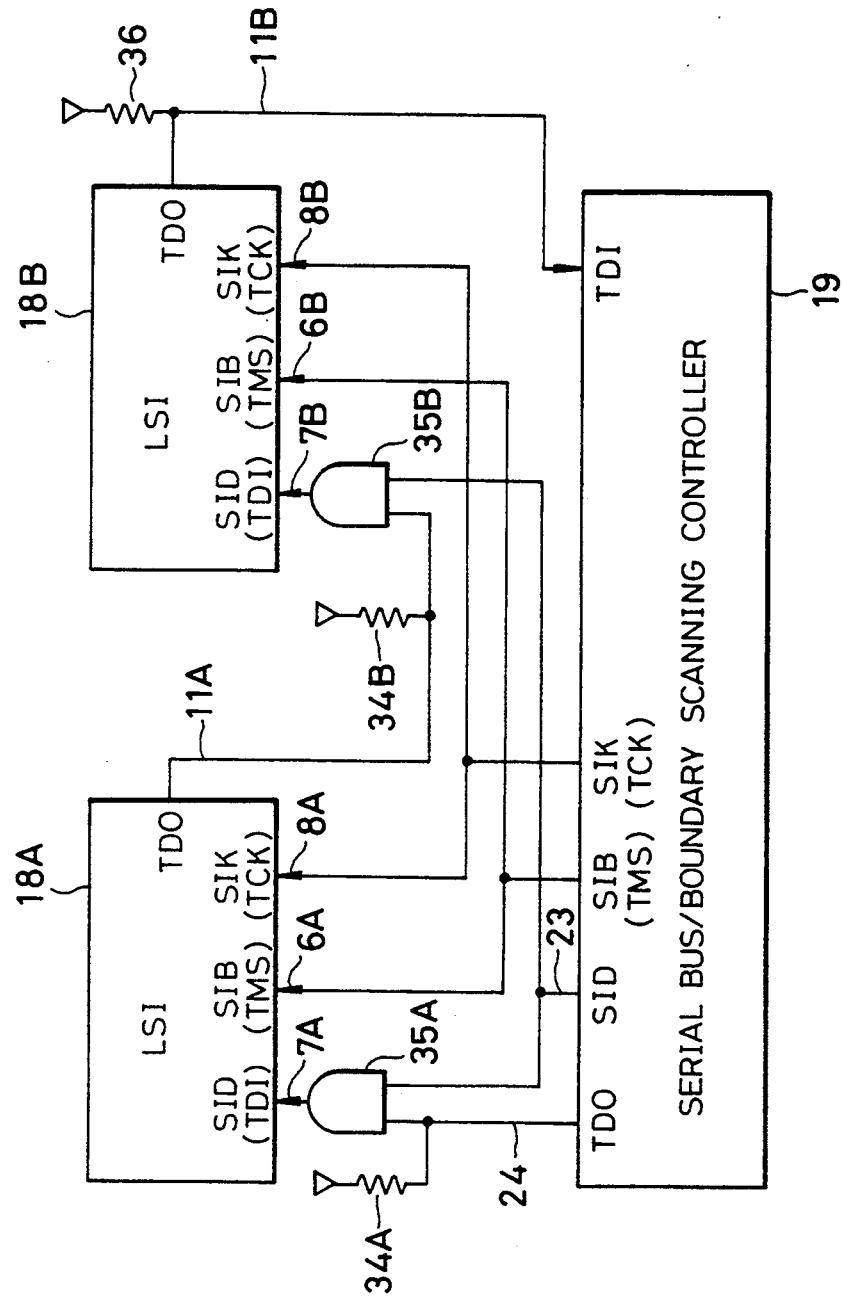
FIG. 5 is a block diagram showing an application of the preferred embodiment of the large-scale integrated circuit of the invention.

FIG. 5 shows an example of circuit as application of the preferred embodiment of the LSI according to the invention. In the shown example, two LSIs (as represented by 18A and 18B) are controlled by a controller 19. Like reference numerals to FIG. 1 will represent the like elements. In FIG. 5, the serial bus/boundary scanning controller 19 generate a test data output (TDO) 24 and a serial data (SID) 23 to apply them as two inputs for a two-input AND gate 35A, and to apply the serial data (SID) 23 as one input of a two-input AND gate 35B. Respective outputs 7A and 7B of the AND gates 35A and 35B are connected to data terminals SID (TDI) of the LSIs 18A and 18B. Also, the controller 19 generates the bus busy signal (SIB)/test mode select signal (TMS) to apply then to respective control terminals 6A and 6B of LSIs 18A and 18B. The controller 19 further generates the clock (SIK)/test clock (TCK) to apply to respective clock terminals 8A and 8B of the LSIs 18A and 18B.

The test data output (TDO) 11A of the LSI 18A serves as another input of the AND gate 35B. The test data output (TDO) 11B of the LSI 18B serves as the test data input (TDI) for the controller 19. It should be noted that the reference numerals 34A, 34B, 36 denotes pull-up resistors.

Upon turning ON of power supply, the controller 19 makes the test mode select signal (bus busy signal) 6A and 6B HIGH level and maintains the HIGH level for a period corresponding to five clocks 8A and 8B. Thereafter, the boundary scanning function blocks 2 in the LSIs 18A and 18B are reset the functions and placed in the disabled condition. Then, the serial bus function blocks 3 are enabled to perform the serial bus control. At this time, all test data outputs (TDO) 24, 11A, 11B are held HIGH level by the pull-up resistors 34A, 34B and 36.

At this condition, the controller 19 can generate the serial data (SID) 23 for supplying to respective data terminals 7A and 7B of respective LSIs 18A and 18B, or enable the boundary scanning function by outputting (000000000) to the main address for enabling the boundary scanning function block 2 and disabling the serial bus function block 3.

Figure 6:
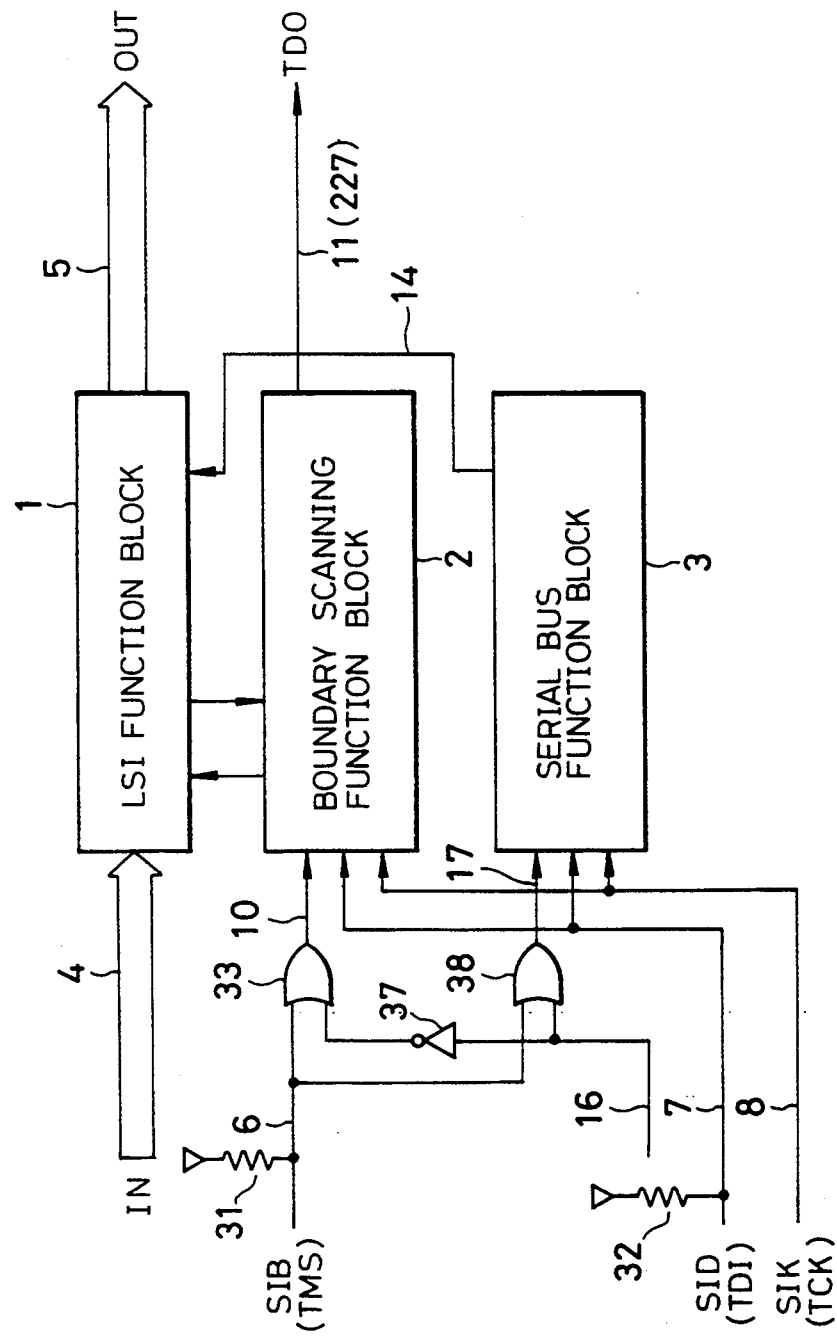
FIG. 6 is a block diagram of the second embodiment of the large-scale integrated circuit of the invention.

FIG. 6 is a block diagram illustrating the second embodiment of the large-scale integrated circuit device according to the present invention. Like reference numerals to FIG. 1 represent the like element. In the shown embodiment, the boundary scanning function block enabling control signal 9 and the serial bus function block freezing (SB freezing) signal 15 are omitted, and in place, an external select signal 16 is added. The select signal 16 is input to the OR gate 33 via an inverter 37. Then, the select signal 16 and the serial bus busy signal (SIB) 6 become two inputs of an OR gate 38. The output 17 of the OR gate 38 serves as the serial bus busy signal (SIB) for the serial bus function block 3.

Initially, while the select signal 16 is held LOW level, the test mode select input 10 of the boundary scanning function block 2 is constantly held HIGh level by the effect of the inverter 37 and the OR gate 33. Therefore, the boundary scanning function block 2 is held in reset and disabled state. Since the bus busy signal 6 is input to the serial bus function block 3 as the signal 17 via the OR gate 38, the serial bus function block 3 initiates operation.

On the other hand, when the select signal 16 becomes HIGH level, the bus busy signal 6 becomes HIGH level by the OR gate 38. Therefore, the bus busy signal 17 for the serial bus function block 3 becomes HIGH level so that the serial bus function block 3 terminates its operation. At this time, the test mode select signal (TMS) 6 appears on the output 10 of the OR gate 33 so that the boundary scanning function block 2 initiates the operation.

In the second embodiment set forth above, although the select terminal 16 is increased, modification of the circuit design in the serial bus function block 3 (addition of the circuit of FIG. 3) becomes unnecessary.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

For instance, in the first and second embodiments set forth above, various modification should be obvious to those skilled in the art. For instance, it is possible to form the LSI with only common clock terminal, only common control terminal for bus busy state and test mode selection, or only common data terminal. In short, the foregoing circuit may be modified to make at least one set of terminals in common among three sets of terminals.

As set forth, according to the present invention, since the terminals required for the serial bus function and the boundary scanning function are made in common, it can minimize the number of additional terminals in addition to the terminals for the original function of the LSI per se. Therefore, it becomes possible to eliminate increasing of the size of the LSI package.

What is claimed is:

1. A large-scale integrated circuit comprising:
a large-scale integrated circuit function block
a serial bus function block for setting and changing of an internal function of the large-scale integrated circuit function block, said serial bus function block including a clock terminal receiving a clock signal, a bus busy terminal receiving a serial bus busy signal as an operation designating signal and a serial data terminal receiving a serial data;
a boundary scanning function block for checking wiring of the large-scale integrated circuit function block after installation on a circuit board, said boundary scanning function block including a clock terminal receiving a clock signal, a test mode select terminal receiving a test mode select signal and a test data terminal receiving a test data;
a first common terminal being in common with the bus busy terminal and the test mode select terminal;
a second common terminal being in common with the serial data terminal and the test data terminal;
a select terminal for receiving a select signal for selectively activating one of said serial bus function block and said boundary scanning function block;
first gate means for blocking supply of the serial bus busy signal supplied to said first common terminal, to said boundary scanning function block when said select signal activates said serial bus function block; and
second gate means for blocking supply of the test mode select signal supplied to said first common terminal, to said serial bus function block when said select signal activates said boundary scanning function block;
wherein each of said first and second gate means is controlled respectively by one of complementary signals of the select signal.

2. A large-scale integrated circuit device as set forth in claim 1, further comprising a third common terminal being in common clock terminals of said serial bus function block and said boundary scanning function block.

3. A large-scale integrated circuit device comprising:
a large-scale integrated circuit function block:
a serial bus function block for setting and changing of an internal function of the large scale integrated circuit function block, said serial bus function block including a clock terminal receiving a clock signal, a bus busy terminal receiving a serial bus busy signal as an operation designating signal and a serial data terminal receiving a serial data;
a boundary scanning function block for checking wiring of board, said boundary scanning function block including a clock terminal receiving a clock signal, a test mode select terminal receiving a test mode select signal and test data terminal receiving a test data;
a first common terminal being in common with the bus busy terminal and a test mode select terminal;
a second common terminal being in common with the serial data terminal and the test data terminal;
gate means for supplying a signal supplied to said first common terminal to said boundary scanning function block in response to a gate signal;
address detecting means provided in said serial bus function block for detecting signal supplied to said second common terminal representing a specific address pattern to generate said gate signal while said boundary scanning function block is deactivated state; and
activation control means provided in said boundary scanning function block and responsive to a signal supplied from said gate means for activating the boundary scanning function and deactivation the serial bus function.

4. A large-scale integrated circuit device as set forth in claim 3, further comprising a third common terminal being in common clock terminals of said serial bus function block and said boundary scanning function block.

5. A large-scale integrated circuit device as set forth in claim 3, wherein said activation control means generates an activation signal for activating said boundary scanning function in response to the signal supplied from said gate means.

6. A large-scale integrated circuit device as set forth in claim 5, wherein said serial bus function block includes means for deactivating said detecting function of said address detecting means in response to said activation signal.

7. A large-scale integrated circuit device as set forth in claim 5, wherein said activation control means generates a deactivation signal for deactivating said boundary scanning function when a signal supplied to said first common terminal via said gate means is maintained for predetermined period of time.

8. A large-scale integrated circuit device as set forth in claim 5, wherein said effectuation control means comprises a D-type flip-flop taking said activation signal as a data input and said detection output of said address detecting means as a reset input, and an OR gate taking the output of said D-type flip-flop as one input and the signal supplied to said common terminal of said first pair as another input.

* * * * *